(12) United States Patent
Ali et al.

(10) Patent No.: US 9,904,334 B2
(45) Date of Patent: Feb. 27, 2018

(54) COOLING ELECTRONIC DEVICES USING FLOW SENSORS

(71) Applicant: Apple Inc., Cupertino, CA (US)

(72) Inventors: Ihab A. Ali, Beirut (LB); Frank F. Liang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 613 days.

(21) Appl. No.: 14/197,144

(22) Filed: Mar. 4, 2014

(65) Prior Publication Data

US 2014/0185219 A1 Jul. 3, 2014

Related U.S. Application Data

(62) Division of application No. 12/241,010, filed on Sep. 29, 2008, now Pat. No. 8,695,690.

(51) Int. Cl.
| | |
|---|---|
| F24F 7/00 | (2006.01) |
| F25B 41/00 | (2006.01) |
| F25D 21/06 | (2006.01) |
| F25B 47/00 | (2006.01) |
| G06F 1/20 | (2006.01) |
| H01L 23/34 | (2006.01) |
| H01L 23/467 | (2006.01) |
| G06F 1/16 | (2006.01) |

(52) U.S. Cl.
CPC ............ *G06F 1/203* (2013.01); *G06F 1/1613* (2013.01); *G06F 1/206* (2013.01); *H01L 23/34* (2013.01); *H01L 23/467* (2013.01); *H01L 2924/0002* (2013.01); *Y02B 60/1275* (2013.01)

(58) Field of Classification Search
CPC .... H01L 23/467; G06F 1/206; Y02B 60/1275
USPC .......... 165/104.21, 104.33; 361/690, 679.48, 361/679.02; 700/276
See application file for complete search history.

(56) References Cited

U.S. PATENT DOCUMENTS

| | | | | |
|---|---|---|---|---|
| 4,686,450 | A | | 8/1987 | Pichat |
| 5,462,601 | A | * | 10/1995 | Falcoff ................ B05B 13/0221 |
| | | | | 118/313 |
| 5,559,673 | A | * | 9/1996 | Gagnon ..................... G06F 1/20 |
| | | | | 165/122 |
| 6,270,313 | B1 | * | 8/2001 | Chuang .................. F04D 29/667 |
| | | | | 415/121.2 |
| 6,319,114 | B1 | | 11/2001 | Nair |
| 6,337,630 | B1 | * | 1/2002 | Hass .......................... G06F 1/20 |
| | | | | 340/606 |
| 6,532,151 | B2 | * | 3/2003 | Osecky ................... G06F 1/206 |
| | | | | 165/225 |
| 6,654,894 | B2 | | 11/2003 | Kaminski et al. |
| 6,661,655 | B2 | | 12/2003 | Yin |
| 6,702,665 | B1 | | 3/2004 | Tai |

(Continued)

FOREIGN PATENT DOCUMENTS

JP 2003086981 3/2003

*Primary Examiner* — Henry Crenshaw
(74) *Attorney, Agent, or Firm* — Kilpatrick Townsend & Stockton

(57) ABSTRACT

An electronic device can be provided with a housing having at least one wall defining a cavity and a flow sensor at least partially contained within the cavity. The flow sensor may be configured to detect a flow characteristic related to the flow of a fluid through a first portion of the cavity. The electronic device may also include a processor configured to alter a performance characteristic of the electronic device based on the detected flow characteristic.

19 Claims, 3 Drawing Sheets

(56) References Cited

U.S. PATENT DOCUMENTS

| | | |
|---|---|---|
| 6,792,550 B2 | 9/2004 | Osecky |
| 6,889,908 B2 | 5/2005 | Crippen |
| 7,062,963 B2 | 6/2006 | Fujiwara |
| 7,096,147 B1 | 8/2006 | Low |
| 7,117,054 B2 | 10/2006 | Frankel et al. |
| 7,284,423 B2* | 10/2007 | Kuzuyama ............... G01F 5/00 73/202 |
| 7,290,721 B2 | 11/2007 | Cheng |
| 7,360,945 B2 | 4/2008 | Kardach |
| 7,464,277 B2* | 12/2008 | Prosperi ................. G06F 1/206 713/300 |
| 7,676,302 B2 | 3/2010 | Frankel |
| 7,937,188 B2 | 5/2011 | Liu |
| 2002/0145847 A1* | 10/2002 | Crosby ................. F16M 11/10 361/679.02 |
| 2004/0218355 A1* | 11/2004 | Bash ................. H05K 7/20745 361/690 |
| 2005/0182523 A1* | 8/2005 | Nair .................... F24F 11/0001 700/276 |
| 2006/0121421 A1* | 6/2006 | Spitaels ................. G06F 1/206 434/118 |
| 2006/0139880 A1* | 6/2006 | Tate .......................... G06F 1/20 361/697 |
| 2007/0103321 A1 | 5/2007 | Yen |
| 2007/0165377 A1* | 7/2007 | Rasmussen .......... H05K 7/2079 361/695 |

\* cited by examiner

COOLING ELECTRONIC DEVICES USING FLOW SENSORS

CROSS-REFERENCE TO RELATED APPLICATIONS

This is a divisional of U.S. patent application Ser. No. 12/241,010, filed Sep. 29, 2008, entitled "METHODS FOR COOLING ELECTRONIC DEVICES USING FLOW SENSORS", which is hereby incorporated by reference herein in its entirety for all purposes.

FIELD

This can relate to systems and methods for cooling an electronic device, and, more particularly, to systems and methods for cooling an electronic device using flow sensors.

BACKGROUND

As electronic components of various electronic devices (e.g., laptop computers) evolve into faster and more dynamic machines, their power requirements often consequently increase. With this increase in power consumption, an increase in power dissipation in the form of heat results. For example, in a laptop computer, chipsets and microprocessors, such as central processing units ("CPUs") and graphics processing units ("GPUs"), are major sources of heat. Heat dissipation is an important consideration in the design of such electronic devices. If this heat is not adequately dissipated, the electronic components may fail and/or cause damage to the electronic device.

Accordingly, what is needed are systems and methods for cooling an electronic device.

SUMMARY

Systems and methods for cooling an electronic device are provided.

According to one embodiment of the invention, there is provided an electronic device that may include a housing having at least one wall defining a cavity and a flow sensor at least partially contained within the cavity. The flow sensor may be configured to detect a first flow characteristic related to the flow of a fluid through a first portion of the cavity. The electronic device may also include a processor coupled to the flow sensor. The processor may be configured to alter the performance of the electronic device based on the detected first flow characteristic.

According to another embodiment of the invention, there is provided an electronic device that may include a housing defining a cavity, a cooling component at least partially contained within the cavity, and a flow sensor. The flow sensor may be configured to detect a first flow characteristic related to the flow of a fluid through the cooling component.

According to yet another embodiment of the invention, there is provided a method for cooling an electronic device that may include a housing having at least one wall defining a cavity. The method may include detecting a first flow characteristic related to the flow of a fluid through a first portion of the cavity, and altering the performance of the electronic device based on the detected first flow characteristic.

According to yet still another embodiment of the invention, there is provided a method of manufacturing an electronic device. The method may include providing a housing defining a cavity, and providing a flow sensor that detects a first flow characteristic related to the flow of a fluid through a first portion of the cavity.

BRIEF DESCRIPTION OF THE DRAWINGS

The above and other features of the invention, its nature and various advantages will become more apparent upon consideration of the following detailed description, taken in conjunction with the accompanying drawings, in which like reference characters refer to like parts throughout, and in which.

DETAILED DESCRIPTION

Systems and methods for cooling an electronic device using flow sensors are provided and described with reference to FIGS. 1-4.

Figure 1:
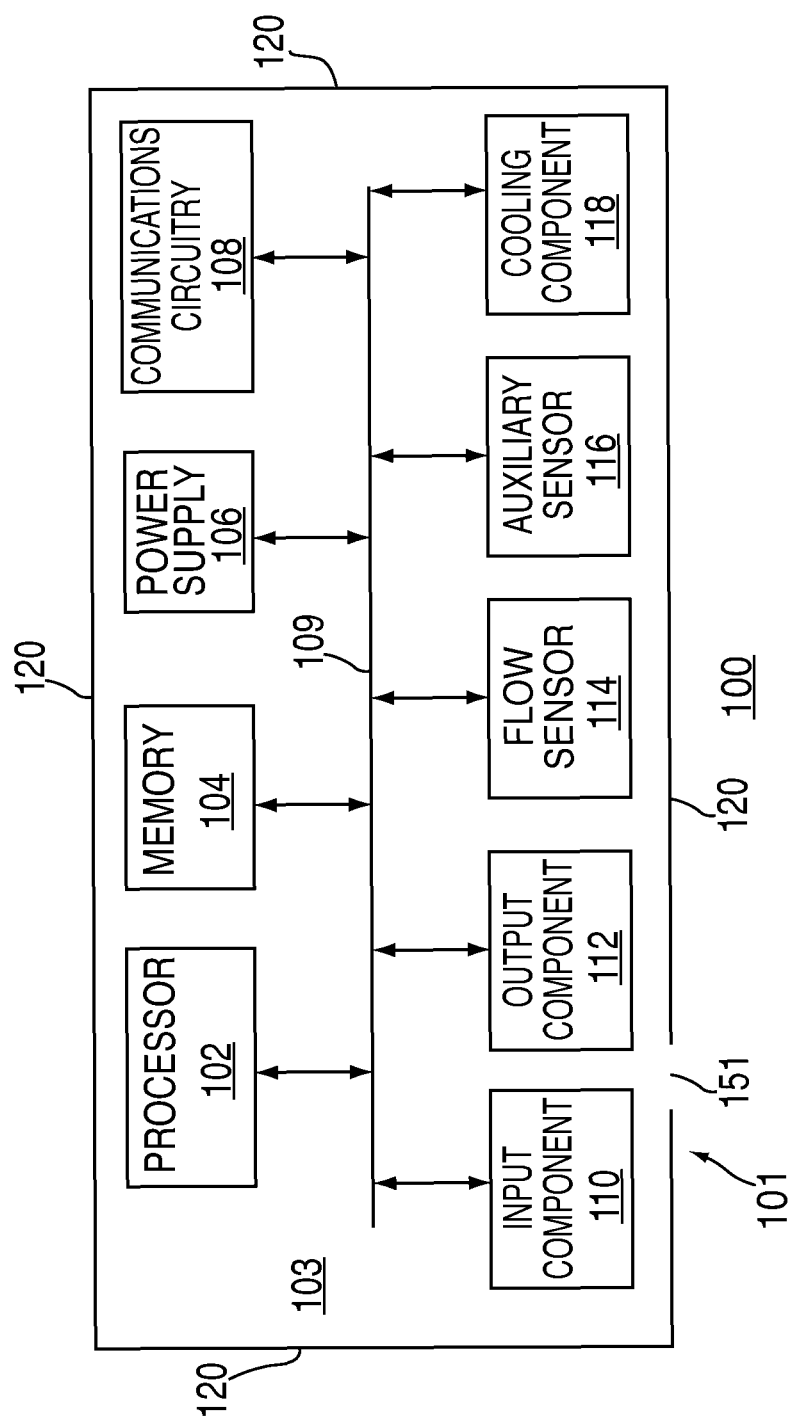
FIG. 1 shows a simplified schematic diagram of an electronic device, according to some embodiments of the invention.

FIG. 1 is a simplified schematic diagram of an electronic device 100 in accordance with some embodiments of the invention. The term "electronic device" can include, but is not limited to, music players, video players, still image players, game players, other media players, music recorders, video recorders, cameras, other media recorders, radios, medical equipment, domestic appliances, transportation vehicle instruments, musical instruments, calculators, cellular telephones, other wireless communication devices, personal digital assistants, remote controls, pagers, computers (e.g., desktops, laptops, tablets, servers, etc.), monitors, televisions, stereo equipment, set up boxes, set-top boxes, boom boxes, modems, routers, keyboards, mice, speakers, printers, and combinations thereof.

As shown in FIG. 1, electronic device 100 may include housing 101, processor 102, memory 104, power supply 106, communications circuitry 108, bus 109, input component 110, output component 112, flow sensor 114, auxiliary sensor 116, and cooling component 118. Bus 109 may include one or more wired or wireless links that provide paths for transmitting data and/or power, to, from, or between various components of electronic device 100 including, for example, processor 102, memory 104, power supply 106, communications circuitry 108, input component 110, output component 112, flow sensor 114, auxiliary sensor 116, and cooling component 118.

Memory 104 may include one or more storage mediums, including, but not limited to, a hard-drive, flash memory, permanent memory such as read-only memory ("ROM"), semi-permanent memory such as random access memory ("RAM"), any other suitable type of storage component, and any combinations thereof. Memory 104 may include cache memory, which may be one or more different types of memory used for temporarily storing data for electronic device applications.

Power supply 106 may provide power to the electronic components of electronic device 100. In some embodiments, power supply 106 can be coupled to a power grid (e.g., when device 100 is not a portable device, such as a desktop computer). In some embodiments, power supply 106 can include one or more batteries for providing power (e.g., when device 100 is a portable device, such as a cellular telephone or a laptop computer). As another example, power supply 106 can be configured to generate power from a natural source (e.g., solar power using solar cells).

Communications circuitry 108 may be provided to allow device 100 to communicate with one or more other electronic devices using any suitable communications protocol. For example, communications circuitry 108 may support Wi-Fi™ (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, and any combinations thereof. Communications circuitry 108 can also include circuitry that enables device 100 to be electrically coupled to another device (e.g., a computer or an accessory device) and communicate with that other device.

One or more input components 110 may be provided to permit a user to interact or interface with device 100. For example, input component 110 can take a variety of forms, including, but not limited to, an electronic device pad, dial, click wheel, scroll wheel, touch screen, one or more buttons (e.g., a keyboard), mouse, joy stick, track ball, microphone, camera, video recorder, and any combinations thereof. Each input component 110 may be configured to provide one or more dedicated control functions for making selections or issuing commands associated with operating device 100.

One or more output components 112 can be provided to present information (e.g., textual, graphical, audible, and/or tactile information) to a user of device 100. Output component 112 can take a variety of forms, including, but not limited to, audio speakers, headphones, signal line-outs, visual displays, antennas, infrared ports, rumblers, vibrators, and any combinations thereof.

It should be noted that one or more input components 110 and/or one or more output components 112 may sometimes be referred to individually or collectively herein as an input/output ("I/O") component or I/O or user interface. It should also be noted that one or more input components 110 and one or more output components 112 may sometimes be combined to provide a single I/O component or user interface, such as a touch screen that may receive input information through a user's touch of a display screen and that may also provide visual information to a user via that same display screen.

Housing 101 may at least partially enclose one or more of the various electronic components associated with operating electronic device 100 for protecting them from debris and other degrading forces external to device 100. In some embodiments, housing 101 may include one or more walls 120 that define a cavity 103 within which the various electronic components of device 100 can be disposed. In some embodiments, housing 101 can support various electronic components of device 100, such as I/O component 110 and/or I/O component 112, at the surfaces or within one or more housing openings 151 through the surfaces of walls 120 of housing 101. Housing openings 151 may also allow certain fluids (e.g., air) to be drawn into and discharged from cavity 103 of electronic device 100 for helping to manage the internal temperature of device 100.

In some embodiments, one or more of the electronic components of electronic device 100 may be provided within its own housing component (e.g., input component 110 may be an independent keyboard or mouse within its own housing component that may wirelessly or through a wire communicate with processor 102, which may similarly be provided within its own housing component). Housing 101 can be formed from a wide variety of materials including, but not limited to, metals (e.g., steel, copper, titanium, aluminum, and various metal alloys), ceramics, plastics, and any combinations thereof. Housing 101 may also help to define the shape or form of electronic device 100. That is, the contour of housing 101 may embody the outward physical appearance of electronic device 100.

One or more cooling components 118 can be provided to help dissipate heat generated by the various electronic components of electronic device 100. Cooling components 118 may take various forms, including, but not limited to, fans, heat sinks, heat spreaders, heat pipes, vents or openings in housing 101 of electronic device 100, and any combinations thereof.

One or more flow sensors 114 can be provided to detect one or more characteristics related to the flow of a fluid through a portion of electronic device 100. For example, each flow sensor 114 may be any component or components suitable to detect one or more flow characteristics related to the flow of a fluid through a particular area or space. For example, each flow sensor 114 may take various forms, including, but not limited to, a velocimeter, an interferometer, a Doppler sensing device, and any combinations thereof. A flow characteristic that may be detected by flow sensor 114 may take various forms, including, but not limited to, the velocity of the flow, a change in the velocity of the flow, a rate of the change in the velocity of the flow, and the like. Moreover, a fluid whose flow may be detected by flow sensor 114 may be any fluid traveling through electronic device 100, such as air.

Moreover, one or more auxiliary sensors 116 can be provided to detect one or more auxiliary characteristics related to a current operation, performance, or environmental condition of one or more electronic components or areas of electronic device 100 that may be useful for controlling the cooling of electronic device 100. For example, each auxiliary sensor 116 may take various forms, including, but not limited to, a temperature sensor for detecting the temperature of a portion of electronic device 100, a performance analyzer for detecting an application characteristic related to the current operation of one or more components of electronic device 100 (e.g., output component 112), one or more single-axis or multi-axis accelerometers, angular rate or inertial sensors (e.g., optical gyroscopes, vibrating gyroscopes, gas rate gyroscopes, or ring gyroscopes), magnetometers (e.g., scalar or vector magnetometers), pressure sensors, light sensors (e.g., ambient light sensors ("ALS"), infrared ("IR") sensors, etc.), linear velocity sensors, thermal sensors, microphones, proximity sensors, capacitive proximity sensors, acoustic sensors, sonic or sonar sensors, radar sensors, image sensors, video sensors, global positioning system ("GPS") detectors, radio frequency ("RF") detectors, RF or acoustic Doppler detectors, RF triangulation detectors, electrical charge sensors, peripheral device detectors, event counters, and any combinations thereof. For example, processor 102 may be configured to read data from one or more auxiliary sensors 116 in order to determine the orientation or velocity of electronic device 100, and/or the amount or type of light, heat, or sound that device 100 is being exposed to, and the like.

Processor 102 of device 100 may control the operation of many functions and other circuitry provided by device 100. For example, processor 102 can receive input signals from input component 110 and/or drive output signals through output component 112. Processor 102 may load a user interface program (e.g., a program stored in memory 104 or on another device or server) to determine how instructions received via input component 110 may manipulate the way in which information (e.g., information stored in memory 104 or on another device or server) is provided to the user via output component 112.

According to some embodiments of the invention, processor 102 may control the operation of one or more electronic components of electronic device 100 based on a flow characteristic detected by flow sensor 114 that is related to the flow of a fluid through a portion of cavity 103 of housing 101. Processor 102 may alter the operation of cooling component 118 based at least in part on a flow characteristic detected by flow sensor 114. For example, if flow sensor 114 detects that the velocity of air flowing through a portion of cavity 103 has decreased below a certain threshold velocity, processor 102 may consequentially increase the speed of a fan as provided by cooling component 118. Additionally or alternatively, processor 102 may alter an operational mode of electronic device 100 (e.g., a user interface program may be altered) based at least in part on a flow characteristic detected by flow sensor 114. For example, if flow sensor 114 detects that the velocity of air flowing through a portion of cavity 103 has increased above a certain threshold velocity, processor 102 may consequentially change an operational mode of electronic device 100.

In some embodiments, the performance or mode of an electronic component of electronic device 100 may be altered based on a combination of a flow characteristic detected by flow sensor 114 and another characteristic of electronic device detected by auxiliary component 116, such as the temperature of a portion of cavity 103. Similarly, the performance or mode of an electronic component of electronic device 100 may be altered based on a combination of a flow characteristic detected by flow sensor 114 and a cooling characteristic related to the operation of cooling component 118, such as the speed of a fan. By altering the performance or mode of an electronic component of electronic device 100 based wholly, or at least in part, on a flow characteristic related to the flow of a fluid through cavity 103, electronic device 100 may better control and/or detect problems related to the manner in which electronic device 100 dissipates heat.

Figure 2:
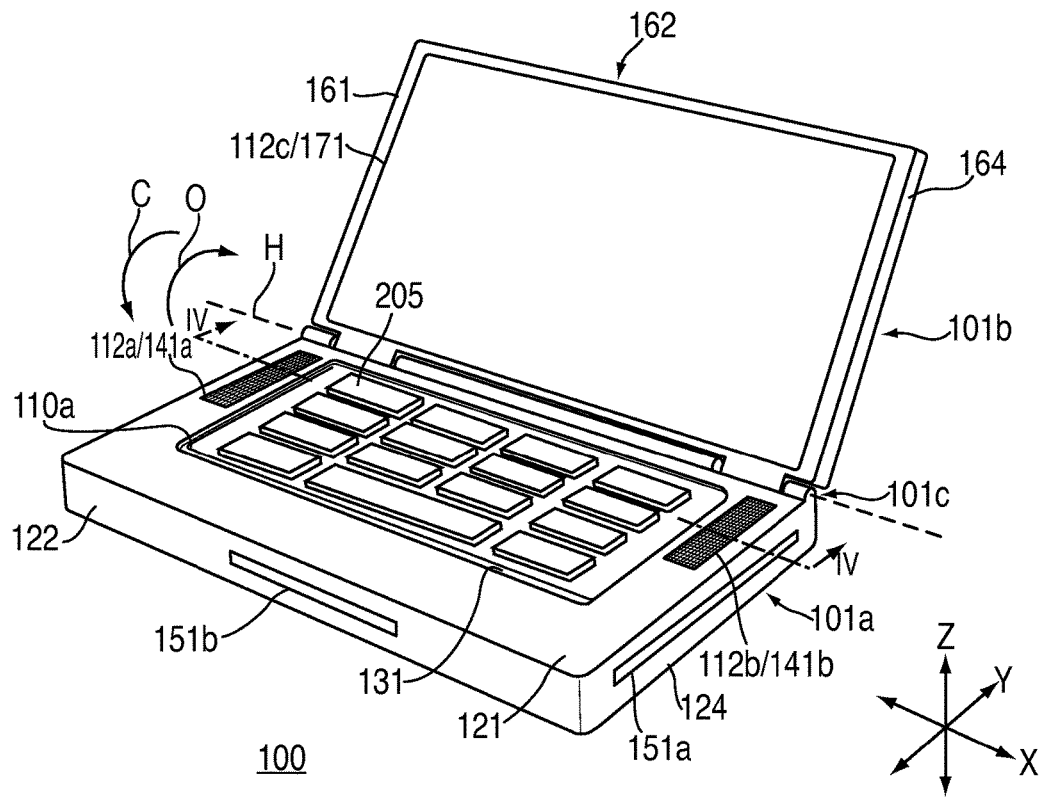
FIG. 2 shows a top, front, right perspective view of the electronic device of FIG. 1 in an open position, according to some embodiments of the invention.
Figure 3:
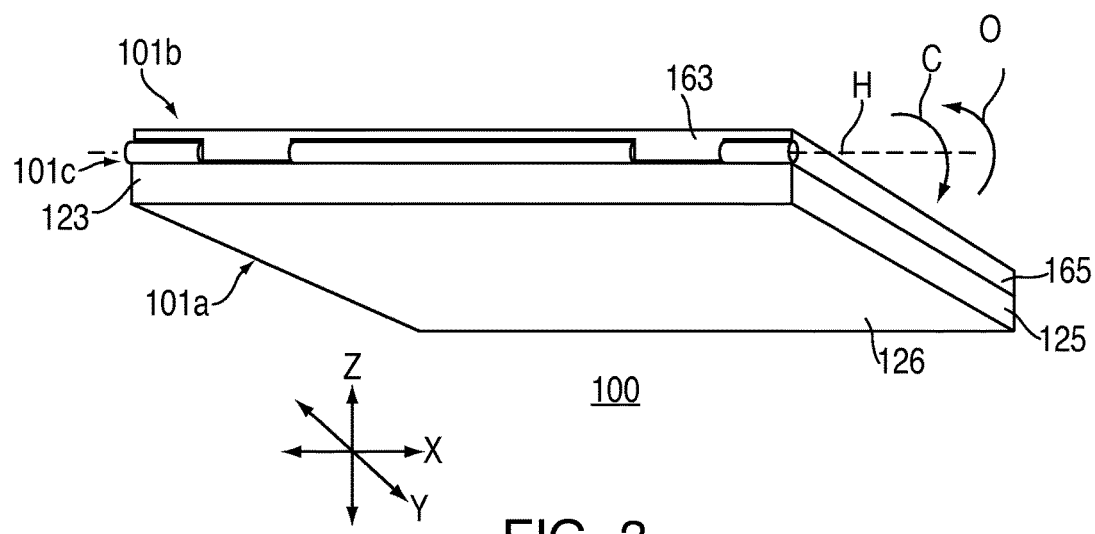
FIG. 3 shows a bottom, back, left perspective view of the electronic device of FIGS. 1 and 2 in a closed position, according to some embodiments of the invention.
Figure 4:
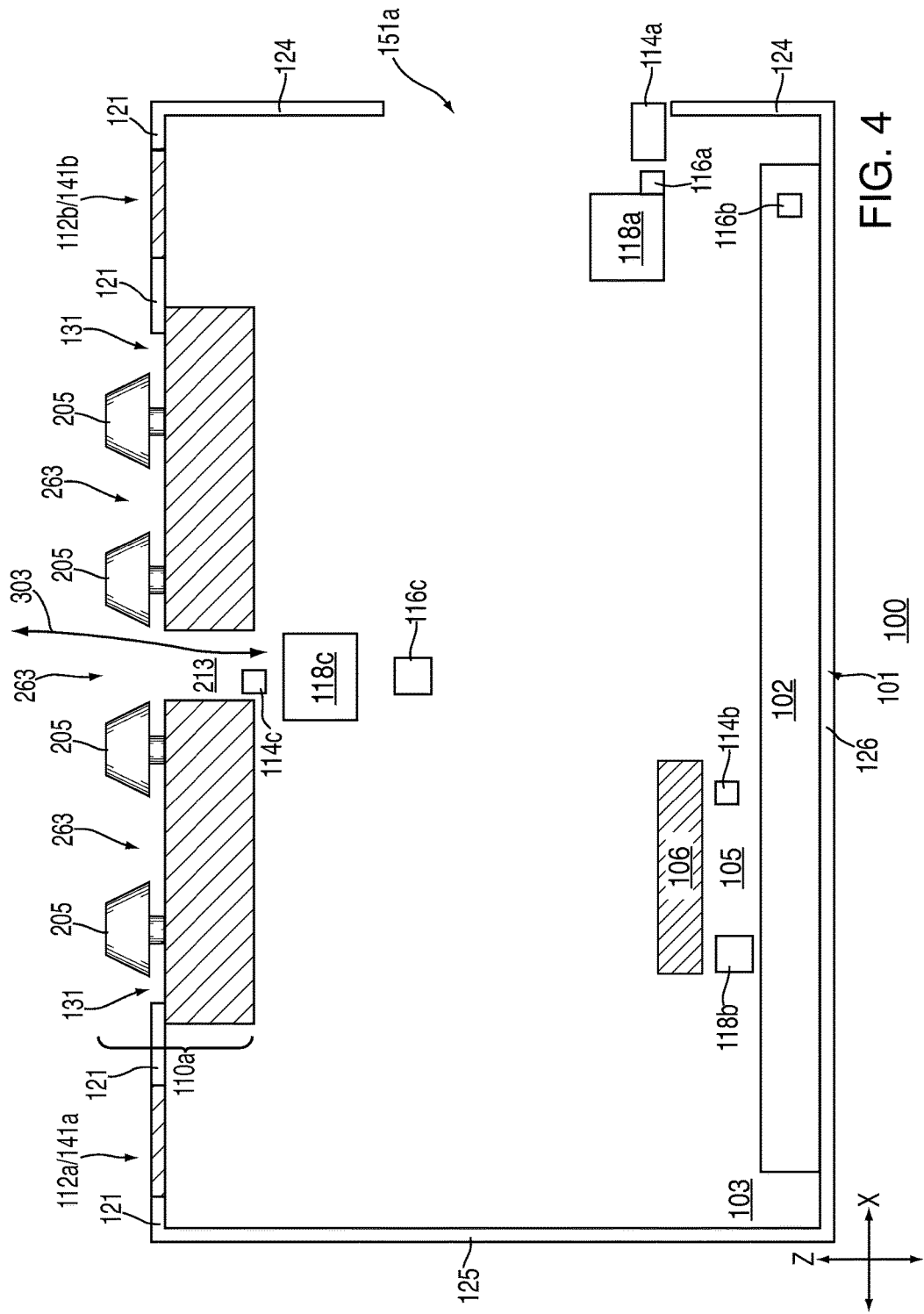
FIG. 4 shows a partial cross-sectional view of a portion of the electronic device of FIGS. 1-3, taken from line IV-IV of FIG. 2, according to some embodiments of the invention.

Electronic device 100 is illustrated in FIGS. 2-4 to be a laptop computer, although it is to be understood that electronic device 100 may be any type of electronic device as described herein in accordance with the invention. As shown in FIGS. 2 and 3, for example, housing 101 of electronic device 100 may be configured to provide two housing components coupled together by a hinge or clutch assembly. Particularly, housing 101 may include a base housing component 101a and a display housing component 101b coupled to one another by a hinge assembly 101c, also known as clutch assembly 101c. Housing components 101a, 101b, and 101c may be configured such that electronic device 100 may be "opened" for use (see, e.g., FIG. 2) by rotating display housing component 101b away from base housing component 101a in the direction of arrow O about hinge axis H of hinge assembly 101c, and such that electronic device 100 may be "closed" (see, e.g., FIG. 3) by rotating display housing component 101b towards base housing component 101a in the direction of arrow C about hinge axis H. However, it should be noted that housing 101 of device 100 is only exemplary and need not include two substantially hexahedral portions coupled by a hinge. For example, in certain embodiments, the housing of device 100 could generally be formed in any other suitable shape, including, but not limited to, one or more housing components or portions that are substantially spherical, ellipsoidal, conoidal, octahedral, and any combinations thereof.

Base housing component 101a may include a top wall 121, various side walls, such as front wall 122, back wall 123, right wall 124, and left wall 125, and a bottom wall 126 opposite top wall 121. In some embodiments, one or more openings may be provided through one or more of the walls of housing component 101a to at least partially expose one or more components of electronic device 100. For example, as shown in FIGS. 2 and 4, an opening 131 may be provided through top wall 121 of base housing component 101a to at least partially expose an input component 110a of electronic device 100. In some embodiments, as shown in FIGS. 2 and 4, for example, openings 141a and 141b may be provided through top wall 121 of base housing component 101a to at least partially expose respective output components 112a and 112b of electronic device 100. Moreover, as shown in FIG. 2, openings 151a and 151b may be respectively provided through right wall 124 and front wall 122 of base housing component 101a of electronic device 100.

Likewise, display housing component 101b may include a top wall 161, various side walls, such as front wall 162, back wall 163, right wall 164, and left wall 165, and a bottom wall (not shown) opposite top wall 161. In some embodiments, one or more openings may be provided through one or more of the walls of housing component 101b to at least partially expose one or more components of electronic device 100. For example, as shown in FIG. 2, an opening 171 may be provided through top wall 161 of display housing component 101b to at least partially expose an output component 112c of electronic device 100.

Input component 110a is illustrated in FIGS. 2 and 4 to be a keyboard assembly, although it is to be understood that input component 110a exposed by opening 131 through top wall 121 of housing component 101a may be any type of input component as described herein in accordance with the invention. Moreover, although output components 112a and 112b are illustrated in FIGS. 2 and 4 to be audio speakers, it is to be understood that each one of output components 112a and 112b exposed by a respective opening 141 through top wall 121 of housing component 101a may be any type of output component as described herein in accordance with the invention. Similarly, although output component 112c is illustrated in FIG. 2 to be a visual display, it is to be understood that output component 112c exposed by opening 171 through top wall 161 of housing component 101b also may be any type of output component as described herein in accordance with the invention.

As shown in FIG. 4, one or more flow sensors 114 may be at least partially contained within cavity 103 of housing 101. By altering the performance or mode of an electronic component of electronic device 100 based wholly or in part on a flow characteristic related to the flow of a fluid through cavity 103 as detected by one or more flow sensors 114, electronic device 100 may better control and/or detect problems related to the manner in which electronic device 100 dissipates heat.

For example, a flow sensor 114a may be provided at least partially within or proximate to housing opening 151a through right wall 124 of housing 101. Flow sensor 114a may be configured to detect a flow characteristic related to the flow of a fluid through at least a portion of housing opening 151a. The detected flow of the fluid may be through opening 151a into cavity 103, out of cavity 103 through opening 151a, and/or in any other suitable direction with respect to flow sensor 114a. In some embodiments, the flow characteristic detected by flow sensor 114a may be the velocity of the flow, a change in the velocity of the flow, or a rate of the change in the velocity of the flow, for example.

In some embodiments, a cooling component may be positioned within cavity 103 for dissipating heat generated by one or more electronic components of device 100 (e.g., by directing a fluid to flow to and/or from housing opening 151a). For example, as shown in FIG. 4, a cooling component 118a may be positioned within cavity 103 such that there may be an at least partially unobstructed path between housing opening 151a and cooling component 118a for helping dissipate heat generated by the various electronic components of electronic device 100 (e.g., processor 102). In some embodiments, cooling component 118a may be configured to direct fluid from within cavity 103 through housing opening 151a. For example, cooling component 118a may be a fan configured to draw fluid from within cavity 103 and to blow the drawn fluid through opening 151a (e.g., to draw air from cavity 103 that may be warm due to heat generated by processor 102 and to blow that warm air through opening 151a for removing the warm air from electronic device 100). Alternatively, in some embodiments, cooling component 118a may be configured to direct fluid from housing opening 151a into cavity 103. For example, cooling component 118a may be a fan configured to draw fluid from opening 151a and to blow the drawn fluid into cavity 103 (e.g., to draw cool air external to device 100 through opening 151a and to blow that cool air over portions of processor 102 that may be hot and in need of cooling). The positioning and geometry of flow sensor 114a, cooling component 118a, and housing opening 151a with respect to one another may be chosen based on thermal management considerations, such as how much heat is to be dissipated.

As another example, as shown in FIG. 4, a flow sensor 114b may be provided within cavity 103 without consideration of a housing opening. Flow sensor 114b may be configured to detect a flow characteristic related to the flow of a fluid through a passageway 105 defined between a portion of processor 102 and a portion of power supply 106. The detected flow of the fluid may be through passageway 105 away from sensor 114b and towards a cooling component 118b positioned at an end of passageway 105, through passageway 105 away from cooling component 118b and towards sensor 114b, and/or in any other suitable direction with respect to flow sensor 114b. The positioning and geometry of flow sensor 114b, cooling component 118b, and passageway 105 with respect to one another may be chosen based on thermal management considerations, such as how much heat is to be dissipated.

As described in co-pending, commonly-assigned U.S. patent application Ser. No. 12/241,009, titled "METHODS AND APPARATUS FOR COOLING ELECTRONIC DEVICES THROUGH USER INTERFACES," filed Sep. 29, 2008, which is hereby incorporated by reference herein in its entirety, one or more holes or ports may be provided through one or more portions of an I/O component or any other electronic component of an electronic device for providing at least a portion of a passageway between an opening in a housing and a cooling component or any other component contained in a cavity of the electronic device. For example, as shown in FIG. 4, one or more ports may be provided through keyboard assembly 110a for providing one or more portions of a cooling passageway 303 extending between housing opening 131 and a cooling component 118c positioned within cavity 103 of electronic device 100.

Keyboard assembly 110a may be positioned with respect to housing 101 of electronic device 100 such that at least a portion of one or more keys 205 of keyboard assembly 110a may extend through or may be at least partially exposed by housing opening 131 to be accessible to a user of device 100. The remaining portions of keyboard assembly 110a (i.e., one or more keyboard assembly layers 210 coupled to keys 205) may be contained within cavity 103 of housing 101. In some embodiments, keyboard assembly 110a may be positioned with respect to housing opening 131 such that housing opening 131 may not be exposed to other components of device 100 (e.g., cooling component 118c). However, as there may be limited openings provided through housing 101, utilizing the available housing openings for drawing cool air into cavity 103 of device 100 and/or for discharging hot air from cavity 103 of device 100, for example, may be helpful for managing the internal temperature of device 100.

Therefore, one or more ports may be provided through a portion of keyboard assembly 110a positioned between housing opening 131 and other electronic components of device 100 (e.g., cooling component 118c) for providing at least a portion of a passageway between housing opening 131 and an electronic component for cooling electronic device 100. For example, as shown in FIG. 4, one or more cooling ports 213 may be provided through keyboard assembly layer 210 of keyboard assembly 110a. Moreover, one or more spacings 263 may be provided between two or more keys 205 of keyboard assembly 110a, such that a passageway 303 is provided through spacing 263 and cooling port 213, and between housing opening 131 and cavity 103.

A flow sensor 114c may be provided anywhere along passageway 303. Flow sensor 114c may be configured to detect a flow characteristic related to the flow of a fluid through at least a portion of passageway 303. The detected flow of the fluid may be through opening 131 and cooling port 213 into cavity 103 (e.g., towards cooling component 118c), out of cavity 103 (e.g., from cooling component 118c) through cooling port 213 and opening 131, and/or in any other suitable direction with respect to flow sensor 114c. The positioning and geometry of flow sensor 114c, cooling component 118c, and cooling port 213 with respect to one another may be chosen based on thermal management considerations, such as how much heat is to be dissipated.

As shown in FIG. 4, one or more auxiliary sensors 116 may be provided at least partially within cavity 103 for detecting one or more auxiliary characteristics related to a current operation, performance, or environmental condition of one or more electronic components or areas of electronic device 100 that may be useful for controlling the cooling of electronic device 100. In some embodiments, an auxiliary sensor 116a may be provided proximate to or as a portion of cooling component 118a within cavity 103. Auxiliary sensor 116a may be configured to detect an auxiliary characteristic related to a current operation, performance, or environmental condition of cooling component 118a. For example, auxiliary sensor 116a may be a temperature sensor configured to detect an auxiliary characteristic related to the temperature at a portion of cooling component 118a.

In some embodiments, an auxiliary sensor 116b may be provided proximate to or as a portion of processor 102. Auxiliary sensor 116b may be configured to detect an auxiliary characteristic related to a state of operation, performance, or environmental condition of processor 102. For example, auxiliary sensor 116b may be a performance analyzer for detecting an application characteristic of processor 102 (e.g., for detecting the type of user interface program that processor 102 is currently running or for detecting the amount of power that processor 102 is currently requiring).

As another example, as shown in FIG. 4, an auxiliary sensor 116c may be provided within cavity 103 without consideration of a specific electronic component or housing opening. Auxiliary sensor 116c may be positioned in a middle portion of cavity 103 for detecting an auxiliary characteristic related to an environmental condition at that area. For example, auxiliary sensor 116c may be an accelerometer for determining the orientation of device 100.

By altering the performance or mode of an electronic component of electronic device 100 based on a flow characteristic as detected by one or more flow sensors 114 in combination with a cooling characteristic related to the operation of one or more cooling components 118 and/or an auxiliary characteristic as detected by one or more auxiliary sensors 116, electronic device 100 may better control and/or detect problems related to the manner in which electronic device 100 dissipates heat. For example, if flow sensor 114a detects that the velocity of the flow of a fluid through opening 151a is steadily decreasing, while auxiliary sensor 116b detects that processor 102 is running the same application and cooling component 118a is performing consistently, then it may be determined (e.g., through look-up tables or other determination software and/or hardware) that housing opening 151a is somehow blocked and unable to allow a proper amount of fluid to flow out of or into device 100. Based on this determination, electronic device 100 may alter, or may signal a user to alter, the operation of one or more components to help alleviate this detected problem. For example, in an exemplary implementation, processor 102 may provide a user instruction (e.g., via output component 112) that asks a user to check if opening 151a is somehow blocked and, if so, to unblock opening 151a in order to improve the efficiency with which device 100 may cool itself. Alternatively or additionally, processor 102 may instruct cooling component 118a to increase its performance (e.g., to increase its speed if cooling component 118a is a fan) in order to potentially unblock opening 151a without the aid of a user.

While there have been described systems and methods for cooling an electronic device using flow sensors, it is to be understood that many changes may be made therein without departing from the spirit and scope of the invention. It is also to be understood that various directional and orientational terms such as "front" and "back" and "rear," "left" and "right," "top" and "bottom," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Those skilled in the art will appreciate that the invention can be practiced by other than the described embodiments, which are presented for purposes of illustration rather than of limitation, and the invention is limited only by the claims which follow.

What is claimed is:

1. A portable computer, comprising:
   a housing that defines a cavity, the housing comprising a first port that allows airflow between the cavity and an environment external to the portable computer;
   a cooling fan disposed within the cavity; and
   components within the cavity, the components comprising:
      a first airflow sensor that generates a first signal comprising a measurement of airflow through the first port,
      a second airflow sensor that generates a second signal comprising a measurement of airflow over a component within the cavity, and
      a processor that provides, responsive to receiving the first and second signals, a control signal that alters an operation of the component associated with the second airflow sensor.

2. The portable computer as recited in claim 1, wherein the processor determines whether the cooling fan is blocked based upon the first and second signals.

3. The portable computer as recited in claim 1, wherein the processor is configured to determine an application characteristic related to a current operation of the portable computer, and wherein the processor is configured to alter the operation of the component based on the first signal, the second signal, and the application characteristic.

4. The portable computer as recited in claim 1, further comprising:
   a temperature sensor electrically coupled to the processor, wherein the temperature sensor determines an internal temperature of the cavity, and
   wherein the processor alters the operation of the component based on the first signal, the second signal, and the internal temperature.

5. The portable computer as recited in claim 1, further comprising:
   a component sensor configured to (i) detect an operational characteristic of the component and (ii) generate a third signal comprising component operational characteristic information, wherein the processor receives the third signal and provides the control signal based, in part, on the third signal.

6. The portable computer as recited in claim 5, further comprising:
   a third airflow sensor that generates a fourth signal comprising a measurement of airflow through a second port.

7. The portable computer as recited in claim 6, wherein the first signal and the fourth signal are used by the processor to determine whether one of the first and second ports is blocked.

8. A portable computing device, comprising:
   a display pivotally coupled to a base, the base comprising:
      a plurality of walls that define a cavity, wherein a first wall of the plurality of walls comprises a first port that allows airflow between the cavity and an environment external to the portable computer; and
   components within the cavity, the components comprising:
      a cooling fan,
      a first airflow sensor that generates a first signal comprising a measurement of airflow through the first port,
      a second airflow sensor that generates a second signal comprising a measurement of airflow over a first component within the cavity, and a processor that provides, responsive to receiving the first and second signals, a control signal that alters an operation of the first component associated with the second airflow sensor.

9. The portable computing device as recited in claim 8, wherein the processor determines whether the cooling fan is blocked based on the first and second signals.

10. The portable computing device as recited in claim 8, further comprising:
a temperature sensor disposed within the cavity and in communication with the processor, wherein the operation of the first component is changed in accordance with the first signal, the second signal, and a signal from the temperature sensor that provides an internal temperature of the cavity.

11. The portable computing device as recited in claim 8, further comprising:
a component sensor configured to (i) detect an operational characteristic of the first component and (ii) generate a third signal comprising component operational characteristic information, wherein the processor receives the third signal and provides the control signal based, in part, on the third signal.

12. The portable computing device as recited in claim 8, wherein the first component is a processor and the operational characteristic is an operating state the processor.

13. The portable computing device a recited in claim 8, further comprising:
a keyboard assembly, wherein the first port is disposed through the keyboard assembly.

14. The portable computing device as recited in claim 8, further comprising:
a third airflow sensor that generates a fourth signal comprising a measurement of airflow through a second port.

15. The portable computing device as recited in claim 9, wherein the processor is configured to provide a user instruction on a display of the portable computing device when the port is determined to be blocked.

16. A portable computer, comprising:
a housing that defines a cavity, the housing comprising a first port that allows airflow between the cavity and an environment external to the portable computer;
a cooling fan disposed within the cavity; and
components within the cavity, the components comprising:
a first airflow sensor that generates a first signal comprising a measurement of airflow through the first port,
a component sensor configured to (i) detect an operational characteristic of the component and (ii) generate a second signal comprising component operational characteristic information, and
a processor that provides, responsive to receiving the first and second signals, a control signal that alters an operation of the component associated with the component sensor.

17. The portable computer of claim 16, further comprising:
a second airflow sensor that generates a third signal comprising a measurement of airflow over a component within the cavity.

18. The portable computer of claim 17, wherein the processor receives the third signal and provides the control signal based, in part, on the third signal.

19. The portable computer of claim 18 wherein the processor determines whether the cooling fan is blocked based upon the first and third signals.

\* \* \* \* \*